Dec. 2, 1969 D. H. LANE 3,481,795

THERMOELECTRIC DEVICE INCLUDING TIN SOLDER WITH PARTICLES OF IRON, COBALT OR NICKEL

Filed Aug. 9, 1965

United States Patent Office 3,481,795
Patented Dec. 2, 1969

3,481,795

THERMOELECTRIC DEVICE INCLUDING TIN SOLDER WITH PARTICLES OF IRON, COBALT OR NICKEL

Donald H. Lane, Lima, Ohio, assignor to Westinghouse Electric Corporation, Pittsburgh, Pa., a corporation of Pennsylvania Filed Aug. 9, 1965, Ser. No. 478,274
Int. Cl. H01v *1/14;* C22c *31/00*
U.S. Cl. 136—237 6 Claims

ABSTRACT OF THE DISCLOSURE

A self-spacing solder is employed to facilitate the formation of a sound solder joint between electrical contacts and electrical leads affixed to bodies of thermoelectric material. A preferred self-spacing solder comprises a tin-phosphorus alloy having insoluble iron particles admixed therein.

The present invention relates to an improved technique for joining electrical contacts to thermoelectric bodies.

An object of this invention is to provide an improved process, for joining electrical contacts and conductors to thermoelectric bodies.

Another object of this invention is to provide a thermoelectric device capable of withstanding repetitive thermocycling, and/or being capable of operating at temperatures up to the melting point of the thermoelectric material.

Other objects of this invention will, in part, be obvious and will, in part, appear hereinafter.

In order to more fully understand the nature and objects of this invention, reference should be had to the following detailed description and drawings, in which.

In accordance with the teachings of this invention and in attainment of the foregoing objects, there is provided a process for affixing electrical and thermal contacts to a body of thermoelectric material. The process comprises disposing a body of soft solder between opposed surfaces of a body of thermoelectric material and the contacts to be joined thereto. The soft solder consists of at least one metal selected from the group consisting of lead, tin, bismuth and base alloys thereof containing from 2% to 35% by volume of the solder of iron particles disposed throughout the solder. Small additions of a metal selected from the group consisting of phosphorus and lithium can be made to the soft solder to improve the solder's ability to wet surfaces which the solder will join together.

The body of thermoelectric material, along with the bodies of soft solders and the contacts are then placed in a furnace. A stream of hydrogen gas having a dew point of from —20° C. to —100° C. is flowed through the furnace at a rate equivalent to from 100 standard cubic feet per hour to 50 standard cubic feet per hour for a furnace cross-sectional area of 25 square inches. The furnace temperature is between 235° C. and 425° C. The contacts are simultaneously joined to the body of thermoelectric material by the soft solder by heating in the furnace.

Figure 1:
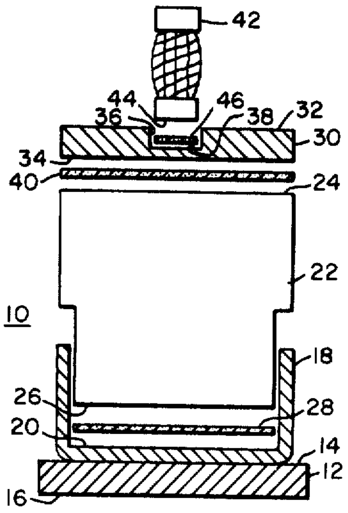
FIGURE 1 is an exploded cross-sectional view of a thermoelectric element made in accordance with the teachings of this invention.

With reference to FIGURE 1, there is shown an exploded cross-sectional view of a thermoelectric element 10 made in accordance with the teachings of this invention. The element 10 comprises a first contact 12 having a top surface 14 and a bottom surface 16. A pellet cup 18 is affixed to the top surface 14 by suitable means such, for example, as brazing or spot welding. The pellet cup 18 has an inside bottom surface 20. A pellet 22 of thermoelectric material having a top surface 24 and a bottom surface 26 is joined to the surface 20 by a soft solder 28 disposed between the bottom surface 26 of the pellet 22 and the bottom surface 20 of the cup 18.

A second contact 30 has a top surface 32 and a bottom surface 34. The contact 30 has a cup-like depression 36 within the top surface 32. The depression 36 has bottom contact surface 38. The contact 30 is joined to the pellet 22 by a soft solder 40 disposed between the bottom surface 34 of the contact 30 and the top surface 24 of the pellet 22.

An electrical lead 42, having a lower contact surface 44, is joined to the contact 30 by a soft solder 46 disposed between the lower contact surfaces 38 and 44.

All of the solder joints of the element 10 are effected simultaneously during a single passage through a suitable furnace.

The furnace may be of the tube type and has a controlled atmosphere. A reducing atmosphere of purified dry hydrogen gas is found to be the most suitable furnace atmosphere for the simultaneous effecting of the solder joints.

The hydrogen atmosphere of the furnace has a dew point which may vary from —20° C. to —100° C. The preferred dew point is —50° C., which enables all the soldered joints of the thermoelectric element to be simultaneously produced, the resulting solder joints being superior to those solder joints formed by methods employing prior art techniques.

The flow of purified dry hydrogen gas in the atmospheric furnace may vary from 100 standard cubic feet per hour to 250 standard cubic feet per hour for a furnace cross-section of approximately 25 square inches. The more suitable flow rate for the hydrogen gas is 150 standard cubic feet per hour for a furnace cross-section of approximately 25 square inches.

Many of the solder joints made by this improved process technique for joining electrical contacts to thermoelectric bodies are effected within less than one minute for furnace time at a preferred operating furnace temperature. However, a furnace time of between 10 to 30 minutes at temperature is preferred.

The minimum furnace time at the operating furnace temperature is dependent upon the type of soft solder being used for effecting the joint, and the operating furnace temperature.

The operating furnace temperature may vary from a minimum of 235° C. depending on the composition of the solder to just below the melting temperature of the body of thermoelectric material which comprises the pellet 22. Depending upon the thermoelectric material and the composition of the solder, which is used in making the pellet 22, the preferred operating temperature range is between 300° C. and 425° C. This preferred operating temperature range produces the most desirable manufacturing conditions of wetting of the thermoelectric element components by the solder, solder flow, and external appearance of the solder joints. Higher operating furnace temperatures cause undersirable voids to occur in the solder interfaces between adjoining thermoelectric element components. Too low of an operating furnace temperature will result in an excessively long furnace time being required to effect the joint between the thermoelectric element components.

A soft solder is a solder whose melting point does not exceed about 375° C. It has been found advantageous to preform the soft solders 28, 40 and 46 shown in FIG. 1, into discs of about .005 inch in thickness. The soft solders 28, 40 and 46 need not be of the same solder composition but the melting temperature of each should be reasonably close to each other to allow all joints to be formed during one passage through a suitable furnace.

The soft solder may consist of at least one metal selected from the group consisting of lead, tin, bismuth, and base alloys and admixtures thereof and containing up to 35% by volume of the solder of insoluble metallic particles admixed therein. An alkali metal, such, for example, as lithium and phosphorus, may be employed for increasing the wettability of the solder alloy. Soft solders prepared from these metals have been effectively employed in joining the components of thermoelectric elements without affecting the product reliability.

High melting particles such, for example, as iron, cobalt, nickel and refractory metals which are essentially insoluble in but wet by, and uniformly distributed throughout, the soft solder are acceptable. In all instances, the metal employed must be compatible with the thermoelectric material to avoid forming undesirable eutectic metal alloys. The insoluble metallic particles should all pass through a 30 mesh screen but no more than 15% should pass through a 325 mesh screen. The screens are of the Tyler series. The maximum particle size should not exceed 0.005 inch in diameter or width in the preferred solder disk.

The size of the insoluble metallic particles determines the clearance, or spacing, between the thermoelectric element components being joined together by the soft solder. If the clearance is too small the soft solder will not penetrate into the joints. If the clearance is too large, the capillary forces are not great enough to "pull" the solder through the joint. Those particles which are smaller than the clearance between the thermoelectric components act as a filler material for the solder. A desirable thickness of the solder layers 28, 40 and 46 should not be less than 0.001 inch nor more than 0.005 inch.

Of several types of soft solders suitable for employment in a new joining process for thermoelectric elements, the preferred soft solder is one consisting of an alloy of up to 0.8%, by weight, of phosphorus and the balance tin with up to 35% by volume of the solder comprising iron particles admixed therein. The composition of the preferred solder is 10% of the volume of solder being iron particles admixed within the soft solder alloy whose composition is 0.02% by weight of phosphorus and the balance tin. This preferred solder forms a very good bond between the solder components of the thermoelectric element 10. The presence of phosphorus in the solder eliminates the prewetting process steps required by some prior art process procedure.

Other suitable soft solders comprising iron particles admixed therein are pure tin, tin-lead alloys and lead-tin-bismuth alloys. These types of soft solders also produce a more reliable thermoelectric element than those thermoelectric elements made by previously known bonding methods.

The soldered joints made in accordance with the teaching of this invention are physically stronger than those solder joints made by using hard solders. Hard solders are considered to be those solders which have a melting point in excess of 375° C.

The tin from the soft solders 28 and 40 shown in FIGURE 1 coat part of the surfaces of the pellet 22. The presence of tin on contact surfaces, 24 and 26, and the size of the pellet 22, reduces, or completely eliminates, the harmful evaporation of the thermoelectric material, depending upon the operating temperatures of the contact 12.

The soldered joint of predominantly tin is easily repairable should a crack be visible in the thermoelectric element 10 after the joining process. The pellet 22 can easily be removed and replaced by a new pellet of thermoelectric material and the necessary solder joints effected to make a satisfactory thermoelectric element 12.

Since tin is the predominant metal in the soft solder, solidification of the solder joint during the operation of the completed thermoelectric element occurs in relatively a short time. It is therefore necessary to effect the necessary solder joint repairs before the thermoelectric element 10 is actually placed in operation, such, for example, as a component in a thermoelectric generator. A "hard soldered" thermoelectric element cannot be repaired and is usually scrapped.

The pellet 22, shown in FIGURE 1, may consist of the body of thermoelectric material such as lead telluride, germanium-bismuth-telluride, germanium telluride and zinc antimonide. Generally, metallic sulfides, selenides, antimonides and tellurides may be employed in this process for constructing a thermoelectric element, embodying the teachings of this invention.

In FIGURE 1, both of contracts 12 and 30 are made from an electrically and thermally conductive metal. Suitable metals which may be employed as contact members are iron, cobalt, nickel, Monel, copper and stainless steel. Both contacts 12 and 30 may have a metallic coating, such as tin, to enhance the perfecting of the required solder joints in making the thermoelectric element 10. The metallic coating increases the wettability of the contacts 12 and 30 by the soft solders, 28, 40 and 46.

Both the uncoated and the coated type of contacts 12 and 30 may have various physical shapes. The contacts 12 and 30 may consist of members having flat surfaces on both sides. The contacts 12 and 30 may also have either cup-like depressions in one or both surfaces or a pellet cup affixed to one surface to facilitate the assembly operations.

Figure 2:
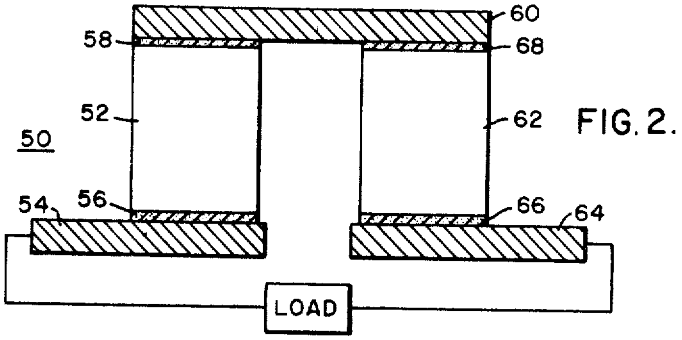
FIGURE 2 is a cross-sectional view of a thermoelectric couple made in accordance with the teachings of this invention.
Figure 3:
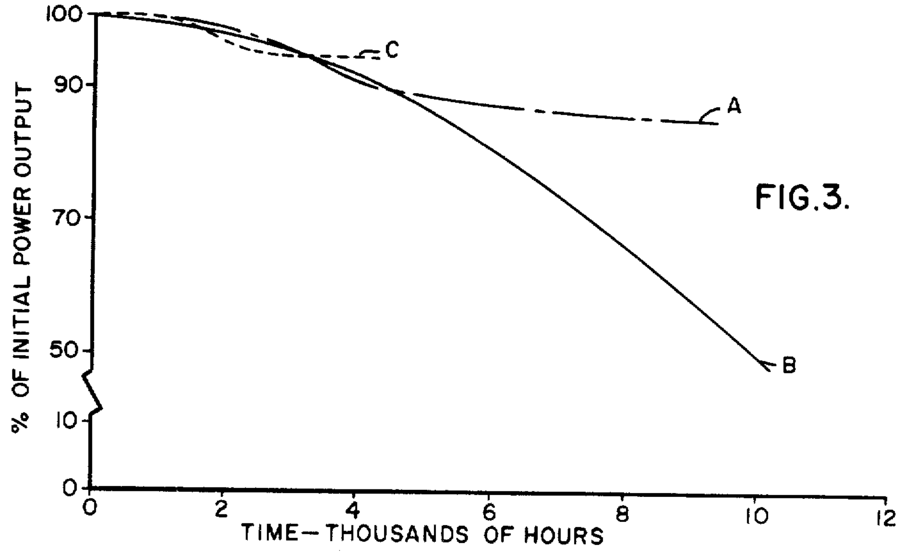
FIGURE 3 is a graph showing the improvement of thermoelectric couples made in accordance with the teaching of this invention over prior art devices.

With reference to FIG. 2 there is shown a thermoelectric couple 50 made in accordance with the teachings of this invention. The thermoelectric couple 50 is fabricated in a similar manner as the previously described thermoelectric element 10 of FIGURE 1.

A pellet 52 of N-type thermoelectric material, such as lead-telluride is joined at one end to a contact 54 by a soft solder 56. The pellet 52 is joined at its opposite end by a soft solder 58 to one end of a contact 60. The contact 60 is shared with a pellet 62 of P-type thermoelectric material.

The pellet 62 of P-type thermoelectric material, such, for example, as germanium-bismuth-telluride, is joined to a contact 64 at one end by a soft solder 66. A soft solder 68 joins the opposite end of the pellet 62 to the contact 60.

The contacts 54, 60, and 64 are made of the same material as the contacts 12 and 30 shown in FIGURE 1. The contacts 54, 60, and 64 may also be of the same general physical configuration as the contacts 12 and 30.

The soft solders 56, 58, 60 and 68 may be a metal selected from a group consisting of lead, tin, bismuth, phosphorus and admixtures and alloys thereof with up to 35% of volume of the solder being insoluble metallic particles admixed therein.

All the required operations can be effected simultaneously in the same manner as the joining operation described in fabricating the thermoelectric element 10 shown in FIGURE 1.

The following examples are illustrative of the teachings of this invention.

EXAMPLE I

An improved thermoelectric element was made in the following manner:

Two large preformed soft solder disks and one small-preformed solder disk were made from an alloy of tin and phosphorus with iron particles admixed therein. The composition of the preformed solder disks was 10% by volume of the solder of iron particles admixed within a soft solder alloy whose composition was 0.02% by weight of phosphorus and the balance tin. The size of the iron particles was between −30 and +325 mesh. No particle size exceeded 0.005 inch in diameter.

One of the large preformed soft solder disks was disposed within a tin coated iron pellet cup affixed to a thermally and electrically conductive iron contact and in contact with the cup's inner contact surface. A pellet of P-type germanium-bismuth-telluride was then disposed within the pellet cup so that the pellet's lower contact surface was in contact with the disk of soft solder.

The second large preformed disk of soft solder was then disposed on top of, and in contact with, the upper contact surface of the pellet. An iron contact containing a cup-shaped depression having an inner bottom contact surface was disposed upon the second large preformed disk of soft solder with the lower contact surface of the contact in contact with the soft solder.

The small preformed solder disk was then disposed within the cup-shaped depression of the contact so that the soft solder disk was in contact with the inner contact surface of the cup-shaped depression. A braided copper electrical lead was then disposed within the cup-shaped depression so that its lower contact surface was in contact with the small preformed soft solder disk.

These assembled components were then positioned in a fixture and all components were then heated to 400° C. ±10° C. for a period of 45±5 minutes in a reducing atmosphere of purified hydrogen gas. The dew point of the hydrogen gas was −50° C. The rate of hydrogen gas flow was 150 standard cubic feet/hour for a furnace cross-section of approximately 25 square inches in area. The thermoelectric element was allowed to cool to below 50° C. and removed from the furnace. The hydrogen flow was maintained during the cooling to room temperature.

The resulting joints which were effected between the assembled components required no prewetting, had a satisfactory appearance and were stronger than similar thermoelectric elements produced by prior known methods employing both hard and soft solders.

EXAMPLE II

An N-type lead-telluride thermoelectric element was prepared in a similar manner as the P-type thermoelectric element in Example I.

The two large and one small preferred solder disks comprised a solder alloy whose composition was 0.02% by weight of phosphorus and the balance tin and with 10% of the volume of the solder comprising iron particles. The size of the iron particles was from −30 mesh to +325 mesh with no particle size exceeding 0.005 inch in diameter. The pellet cup comprised iron and had its inner contact surface coated with tin. Both thermally and electrically conductive contacts comprised iron.

The furnace temperature was 400° C. ±10° C. and the furnace time was 45±5 minutes. The furnace atmosphere was hydrogen gas having a dew point of −50° C. and a gas flow rate of 150 standard cubic feet per hour for a furnace cross-section of approximately 25 square inches.

The N-type lead-telluride thermoelectric element produced showed an improvement in both the physical characteristics of the solder joints and in the operating characteristics of the whole element compared to similar N-type lead-telluride thermoelectric elements produced by known previous methods.

EXAMPLE III

A complete thermoelectric device, or couple, was produced embodying the teachings of this invention.

A preformed disk of soft solder was placed in each of two iron pellet cups affixed to an iron contact. The inner bottom contact surfaces of the pellet cups were tin plated. The soft solder was composed of an alloy of tin and phosphorus having iron particles admixed therein. The size of the iron particles was −30 to +325 mesh. The composition of the said preformed soft solder disk was 10% of the volume of the solder comprising iron particles admixed within the soft solder alloy whose composition was 0.02% by weight of phosphorus and the balance of the alloy was tin.

A pellet of P-type germanium-bismuth-telluride thermoelectric material was placed in one of the pellet cups with the pellet's lower contact surface in contact with the preformed disk of soft solder contained therein. A pellet of N-type lead telluride thermoelectric material was placed in the second pellet cup with the pellet's lower contact surface in contact with the preformed disk of soft solder contained therein.

A second preformed disk of soft solder of the same size and metal composition as the first disk of soft solder was disposed upon, and in contact with, each upper contact surface of the pellets of thermoelectric material. A tin coated iron contact containing a cup-like depression in its upper surface, was disposed upon each of the second preformed disks of soft solder so that a lower contact surface of each of the contacts was in contact with each of the second preformed disks of soft solder.

A preformed disk of soft solder, smaller in size than, but of the same material as, the previously stated preformed disks of soft solder, was placed within the cup-like depression of each of the contacts. A braided copper electrical lead was then disposed within each of the cup-like depressions so that a lower contact surface of each of the braided copper electrical leads was in contact with the smaller preformed disk of soft solder.

The assembled components of the thermoelectric device was then positioned in an assembly jig and heated to 400° C.±10° C. in a controlled atmosphere furnace.

The controlled atmosphere furnace has a reducing atmosphere of purified hydrogen gas having a dew point not greater than −50° C. The gas flow for the purified hydrogen gas was not less than 150 standard cubic feet/hour for a furnace cross-section of approximately 25 square inches. The positioned thermoelectric components remained in this controlled atmospheric furnace for 45±5 minutes whereby all soldered joints between the said thermoelectric device components were simultaneously effected. The thermoelectric couple was then cooled to below 50° C. while the hydrogen gas flow was maintained before removing from the furnace protective atmosphere.

The complete thermoelectric device was removed from its fixture and tested in an atmosphere of argon.

With reference to FIG. 4 there is shown a comparison of life test data compiled from testing the new improved thermoelectric device employing the improved joining process technique with two similar thermoelectric devices produced by known previous methods employing hard solders. All the thermoelectric devices were continuously operated within a 400° C. to 500° C. temperature range.

Curve A represents a thermoelectric device having contacts affixed with a hard solder and being operated in a 400° C. to 450° C. range for its hot junction. The thermoelectric device comprises exactly the same materials as thermoelectric device of Example III except that the solder employed was a hard solder alloy of gold and zinc. It is to be noted that after 8500 hours of operation at temperature the percent of its initial power output is still decreasing and is approximately 88%.

Curve B represents the data compiled for a thermoelectric device having its hot junction operating continuously in the 450° C. to 550° C. range. Its components were assembled using a hard solder comprising a nickel phosphide diffusion bonded joint. It is to be noted that after 10,000 hours of operation the thermoelectric device is still decreasing quite rapidly in its percent of initial power output which has fallen below 50%.

Curve C represents the operating data of a thermoelectric device which was produced embodying the teachings of this invention. It is to be noted that although its operating temperature range for its hot junction is 450° C. to 500° C., its percent of initial power output has reached a plateau of 94% after approximately 2500 hours of continuous operation and shows no sign of decreasing below this plateau after 4000 hours of continuous operation.

EXAMPLE IV

An N-type lead-telluride thermoelectric element was fabricated in a similar manner as the P-type thermoelectric element in Example I except that the preformed solder disks were pure lead and having 10% by volume of the solder of iron particles admixed therein. The iron particles were sized to −30 to +325 mesh. No iron particles exceed 0.005 inch in diameter.

The N-type lead-telluride thermoelectric element required no prewetting of the component parts to be soldered. The solder joints were strong and sound throughout and had a very good visual appearance when compared with similar thermoelectric elements made by prior art methods.

EXAMPLE V

A P-type lead-telluride thermoelectric element was fabricated in a similar manner as the P-type thermoelectric element in Example I except that the preformed solder disks were pure lead with 10% by volume of the solder being iron particles. The iron particle size was −30 to +325 mesh with the maximum size being 0.0005 inch in diameter.

The P-type lead-telluride thermoelectric element required no prewetting of the component parts to be soldered. The solder joints were strong and sound throughout and had a very good visual appearance when compared with similar thermoelectric elements made by prior art methods.

The teachings of this invention provide a capable reproducible means for manufacturing highly reliable thermoelectric devices of uniform quality by means of a continuous, single step, production line, furnace joining operation.

The thermoelectric devices manufactured in accordance with the teachings of this invention possess an excellent operating service capability in both recycling characteristics and in high operating temperature utilization below the melting temperature of the thermoelectric materials. This excellent service capability is achieved when the thermoelectric devices are operated in an inert or a reducing atmosphere.

It is important to note that the soft solders employed in the process taught by this invention eliminate the prewetting requirements of components. One prior art teaching of the use of ultrasonics to prewet the pellets of thermoelectric materials is entirely eliminated.

It is intended that the foregoing description and the drawings be interpreted as illustrative and not in limitation of the invention.

I claim as my invention:

1. A thermoelectric element, said element comprising a body of a thermoelectric material, electrical contacts joined in an electrically conductive relationship with opposite ends of said body of thermoelectric material, a layer of a solder disposed between and joining said body of thermoelectric material to said electrical contacts, said layer of solder consisting of tin and containing insoluble metallic particles of a metal selected from the group consisting of iron, cobalt, and nickel admixed therein, said particles having a size ranging from −30 mesh to +325 mesh and comprising up to 35 percent by volume of said layer of solder.

2. A thermoelectric element, said element comprising a body of thermoelectric material, electrical contacts joined in an electrically conductive relationship with opposite ends of said body of thermoelectric material, a layer of a solder disposed between and joining said body of thermoelectric material to said electrical contacts, said layer of solder consisting of an alloy comprised of up to 0.8 percent by weight of phosphorus and the balance is tin and containing insoluble metallic particles of a metal selected from the group consisting of iron, cobalt, and nickel admixed therein, said particles having a size ranging from −30 mesh to +325 mesh and comprising up to 35 percent by volume of said solder layer.

3. A thermoelectric element, said element comprising a body of thermoelectric material, electrical contacts joined in an electrically conductive relationship with opposite ends of said body of thermoelectric material, a layer of a solder disposed between and joining said body of thermoelectric material to said electrical contacts, said layer of solder being comprised of a solder alloy comprised of 0.02 percent by weight of phosphorus and the remainder is tin and insoluble iron particles admixed therein, said particles having a size ranging from −30 mesh to +325 mesh and comprising 10 percent by volume of said solder layer.

4. A thermoelectric couple, said couple comprising a first body of a first type of thermoelectric material, a second body of a second type of thermoelectric material, electrical contacts joined in an electrically conductive relationship with opposite ends of each of said first and second bodies of thermoelectric material, one of said electrical contacts being in a simultaneously electrically conductive relationship with said first and said second bodies of thermoelectric material, a layer of a solder disposed between and joining said bodies of thermoelectric material to said electrical contacts, said layer of solder consisting of tin and containing insoluble metallic particles of a metal selected from the group consisting of iron, cobalt, and nickel admixed therein, said particles having a size ranging from −30 mesh to +325 mesh and comprising up to 35 percent by volume of said solder.

5. A thermoelectric couple, said couple comprising a first body of a first type of thermoelectric material, a second body of a second type of thermoelectric material, lationship with opposite ends of each of said first and said electrical contacts joined in an electrically conductive resecond bodies of thermoelectric material, one of said electrical contacts being in a simultaneously electrically conductive relationship with said first and said second bodies of thermoelectric material, a layer of a solder disposed between and joining said bodies of thermoelectric material to said electrical contacts, said layer of solder consisting of an alloy comprised of up to 0.8 percent weight of phosphorus and the balance is tin and containing insoluble metallic particles of a metal selected from the group consisting of iron, cobalt, and nickel admixed therein, said particles having a size ranging from −30 mesh to +325 mesh and comprising up to 35 percent by volume of said solder.

6. A thermoelectric couple, said couple comprising a first body of a first type of thermoelectric material, a second body of a second type of thermoelectric material, electrical contacts joined in an electrically conductive relationship with opposite ends of each of said first and said second bodies of thermoelectric material, one of said electrical contacts being in a simultaneously electrically conductive relationship with said first and said second bodies of thermoelectric material, a layer of a solder disposed between and joining said bodies of thermoelectric material to said electrical contacts, said layer of solder consisting of an alloy comprised of 0.02 percent by weight of phosphorus and the balance is tin and containing insoluble iron particles admixed therein, said particles having a size ranging from −30 mesh to +325 mesh and comprising 10 percent by volume of said solder.

References Cited

UNITED STATES PATENTS

| | | | |
|---|---|---|---|
| 3,163,500 | 12/1964 | Konrad et al. | 29—191.2 X |
| 3,208,835 | 9/1965 | Duncan et al. | 136—237 |

FOREIGN PATENTS

| | | |
|---|---|---|
| 894,976 | 4/1962 | Great Britain. |

ALLEN B. CURTIS, Primary Examiner

U.S. Cl. X.R.

75—175; 106—1